United States Patent [19]
Okinoshima et al.

[11] Patent Number: 5,738,976
[45] Date of Patent: Apr. 14, 1998

[54] PHOTO-CURABLE ORGANOPOLYSILOXANE COMPOSITION AND A METHOD FOR PRODUCING A (METH) ACRYLOYLOXYL GROUP-CONTAINING ORGANOPOLYSILOXANE USED THEREIN

[75] Inventors: Hiroshige Okinoshima; Tsutomu Kashiwagi; Shinsuke Yamaguchi, all of Annaka, Japan

[73] Assignee: Shin-Etsu Chemical Co., Ltd., Tokyo, Japan

[21] Appl. No.: 617,240

[22] Filed: Mar. 18, 1996

[30] Foreign Application Priority Data

Mar. 16, 1995 [JP] Japan .................... 7-084722
Mar. 16, 1995 [JP] Japan .................... 7-084723

[51] Int. Cl.$^6$ ............................ G03F 7/075
[52] U.S. Cl. ............... 430/285.1; 430/287.1; 430/288.1; 522/99
[58] Field of Search ............... 430/285.1, 287.1, 430/288.1; 522/99

[56] References Cited

U.S. PATENT DOCUMENTS

| | | | |
|---|---|---|---|
| 4,201,808 | 5/1980 | Cully et al. | 522/99 |
| 4,863,833 | 9/1989 | Fukuyama et al. | 430/287.1 |
| 4,972,005 | 11/1990 | Aoki et al. | 522/99 |
| 5,491,203 | 2/1996 | Matsui et al. | 525/474 |

FOREIGN PATENT DOCUMENTS

| | | | |
|---|---|---|---|
| 63-117024A | 9/1988 | Japan | 522/99 |
| 765776 | 9/1980 | U.S.S.R. | 430/285.1 |

*Primary Examiner*—Cynthia Hamilton
*Attorney, Agent, or Firm*—Cushman Darby & Cushman IP Group Pillsbury Madison & Sutro LLP

[57] ABSTRACT

The composition comprises a (meth)acryloyloxyl group-containing organopolysiloxane having an average molecular weight of 3,000 to 100,000, in terms of polystyrene, and a photosensitizer. Such an organopolysiloxane having an average molecular weight of 3,000 or more is produced by subjecting (meth)acryloyloxypropyltrimethoxysilane and phenyltrimethoxysilane to cohydrolysis and subsequent condensation polymerization to produce a cohydrolysis-condensation polymerization product and then reacting and silylating the same product with a silylating agent such as hexamethyldisilazane. The composition containing such a high molecular weight (meth)acryloyloxyl-group-containing organopolysiloxane is excellent in sensitivity, resolution and storage stability and has little tackiness in uncured state after being coated, as well as being excellent in heat resistance after being cured. Thus, the composition is useful for photosensitive heat-resistant materials for use in semiconductor lithography and photosensitive heat-resistant materials for use in semiconductor passivation.

5 Claims, 4 Drawing Sheets

PHOTO-CURABLE ORGANOPOLYSILOXANE COMPOSITION AND A METHOD FOR PRODUCING A (METH) ACRYLOYLOXYL GROUP-CONTAINING ORGANOPOLYSILOXANE USED THEREIN

BACKGROUND OF THE INVENTION

1. Field of the Invention

The present invention relates to a photo-curable organopolysiloxane composition useful as photosensitive heat-resistant materials for semiconductors, said materials being used for, for example, formation of patterns and passivation in the production of semiconductors; and a method for producing acryloyloxyl or methacryloyloxyl [hereinafter referred to as (meth)acryloyloxyl] group-containing organopolysiloxane useful as a base polymer for, for example, electron beam-curable resin compositions, thermosetting resin compositions or photocurable resin compositions, which compositions are excellent in storage stability and easy in high-purification.

2. Description of the Prior Art

As conventional photosensitive heat-resistant materials for semiconductors, there are known silicone ladder polymer photosensitive heat-resistant materials [see Japanese Pre-examination Patent Publication (Kokai) Nos. 60-108839, 60-108840, 60-108841, 59-193925, 60-76739 and 60-80851]. However, these materials are not practical since they have a low sensitivity and also processes of producing them was complex.

On the other hand, conventionally known (meth) acryloyloxyl group-containing organopolysiloxanes are polymers having a relatively low molecular weight (for example, 2,000 or less in terms of polystyrene by GPC). If it is possible to make the molecular weight higher, these organopolysiloxanes can be cured at a high speed and become useful as a base polymer for, for example, thermosetting resin compositions, electron beam curable resin compositions and photo-curable resin compositions, which compositions are able to form a pattern for use in, for example, semiconductor circuits. However, (meth) acryloyloxyl group-containing organopolysiloxanes having a molecular weight of 3,000 or more (in terms of polystyrene by GPC) have not been yet used as the base polymer.

In order to prepare the (meth)acryloyloxyl group-containing organopolysiloxanes having such a high molecular weight by applying conventionally known methods, for example, a method, wherein a (meth)acryloyloxyl group-containing alkoxysilane and the other alkoxysilane are subjected to cohydrolysis depending upon the intended molecular structure and thereafter the cohydrolyzed product is subjected to condensation polymerization, is conceivable. However, the (meth)acryloyloxyl group-containing organopolysiloxanes having a high molecular weight obtained by this method are unstable since they have a number of silanol groups, and increase in viscosity to gel. Further, since the high molecular weight (meth)acryloyloxyl group-containing organopolysiloxanes are hydrophilic, water-soluble impurities contained therein can not be removed by a solvent extraction method using water and an organic solvent and purification is difficult.

SUMMARY OF THE INVENTION

An object of the present invention is to provide a photo-curable organopolysiloxane composition, which has a practical use and can be produced economically using already industrialized materials, having an excellent sensitivity, resolution and storage stability, having a low tackiness in uncured state after being coated, and having an excellent heat resistance after being cured.

Thus, the present invention provides a photo-curable organopolysiloxane composition comprising:

(A) a (meth)acryloyloxyl group-containing organopolysiloxane having an average molecular weight of 3,000 to 100,000 in terms of polystyrene by GPC represented by the following average compositional formula (1):

$$(CH_2=CR^1COOC_3H_6-)_a(Ph)_bR^2_c(R^7{}_3SiO)_dSiO_{(4-a-b-c-d)/2} \quad (1)$$

wherein $R^1$ represents a hydrogen atom or a methyl group, $R^2$ represents an alkyl or alkenyl group having 1 to 8 carbon atoms, Ph stands for a phenyl group, $R^7$ represents an alkyl or alkenyl group having 1 to 8 carbon atoms, a is a number satisfying $0.05<a<0.9$, b is a number satisfying $0.1<b<0.9$, c is a number satisfying $0\leq c<0.2$, and d is a number satisfying $0<d\leq 0.5$, provided that a+b+c+d should satisfy $0.8\leq a+b+c+d\leq 1.5$; and (B) a photosensitizer.

According to the present invention, there is also provided a cured product produced by irradiating light on said photo-curable (meth)acryloyloxyl group-containing organopolysiloxane composition to cure the same.

The composition of the present invention is excellent in sensitivity, resolution and storage stability and has little tackiness in uncured state after being coated, as well as being excellent in heat resistance after being cured. This composition is useful for photosensitive heat-resistant materials for use in semiconductor lithography and photosensitive heat-resistant materials for use in semiconductor passivation.

DETAILED DESCRIPTION OF THE PREFERRED EMBODIMENTS

The photo-curable organopolysiloxane composition of the present invention will be now described in more detail.

The photo-curable organopolysiloxane composition of the present invention comprises the components (A) and (B).

(Meth)acryloyloxyl group-containing organopolysiloxane of component (A)

The (meth)acryloyloxyl group-containing organopolysiloxane having the average compositional formula (1) used as the component (A) in the present invention is generally an organopolysiloxane having a branched structure. In the average compositinal formula (1), a represents the content of (meth)acryloyloxyl groups which perform an important role in that the composition exhibits sensitivity, and is a number satisfying $0.05<a<0.9$; b represents the content of phenyl groups which provide heat resistance to the resulting cured product, and is a number satisfying 0.1<b<0.9; c is a number satisfying 0≦c<0.2; and d is a number satisfying 0<d≦0.5, preferably 0<d≦0.1; provided that a+b+c+d should satisfy 0.8≦a+b+c+d≦1.5, preferably 1≦a+b+c+d≦1.1. Further, examples of the alkyl or alkenyl group having 1 to 8 carbon atoms represented by $R^2$ in the formula (1) include methyl, ethyl, propyl, isopropyl, butyl, isobutyl, tert-butyl, pentyl, neopentyl, hexyl, heptyl, cyclohexyl, cycloheptyl, octyl, 2-ethylhexyl, vinyl, allyl, propenyl, isopropenyl and butenyl groups. Among them, preferred is a methyl group.

The (meth)acryloyloxyl group-containing organopolysiloxane of the average compositional formula (1) has an average molecular weight of generally 3,000 to 100,000, preferably 5,000 to 50,000, in terms of polystyrene by GPC. If the molecular weight is too small, a surface tackiness in the uncured state of the composition according to the present invention after the composition was coated may be liable to remain. While, a too large molecular weight may result in that it becomes difficult to dissolve the component (A) in solvents.

Although the (meth)acryloyloxyl group-containing organopolysiloxane represented by the average compositional formula (1), which is used in the composition of the present invention, has an average molecular weight, for example, a weight-average molecular weight, of 3,000 to 100,000 in terms of polystyrene by GPC, a (meth)acryloyloxyl group-containing organopolysiloxaneone having an average molecular weight, for example, a weight-average molecular weight, of 3,000 or more in terms of polystyrene by GPC can be generally produced in the following method.

Accordingly, the present invention provides also a method for producing a high molecular weight (meth)acryloyloxyl group-containing organopolysiloxane, which is excellent in storage stability and can be easily purified by water washing and produced by simple processes. The general production method of a (meth)acryloyloxyl group-containing organopolysiloxane having an average molecular weight of 3,000 or more (in terms of polystyrene by GPC) comprises the steps of:

(a) subjecting a (meth)acryloyloxypropylakoxysilane represented by the following general formula (2):

(2)

wherein $R^1$ is a hydrogen atom or a methyl group as defined in the formula (1), $R^3$ is an unsubstituted or substituted monovalent hydrocarbon group, $R^4$ is an unsubstituted or alkoxy-substituted alkyl group, and e is an integer of 0 to 2, and an alkoxysilane represented by the following general formula (3):

(3)

wherein $R^5$ is an unsubstituted or substituted monovalent hydrocarbon group, $R^6$ is an unsubstituted or alkoxy-substituted alkyl group as $R^4$, and n is an integer of 1 to 4 to cohydrolysis and subsequent condensation polymerization to obtain a silanol group-containing cohydrolysis-condensation polymerization product; and (b) reacting the cohydrolysis-condensation polymerization product with a silylating agent to silylate the silanol groups contained therein.

According to said general production method, there can be obtained a (meth)acryloyloxyl group-containing organopolysiloxane having a molecular weight of 3,000 or more, which is excellent in storage stability, by simple steps and in high yield. Further, the thus obtained (meth)acryloyloxyl group-containing organopolysiloxane can be highly purified by washing the same with water in the form of being dissolved in an organic solvent, which is incompatible with water, such as toluene and xylene to thereby remove easily water-soluble impurities.

(a) Cohydrolysis and condensation polymerization step:

In said general production method, the (meth) acryloyloxypropylalkoxysilane represented by said general formula (2) and the alkoxysilane represented by said general formula (3) are first subjected to cohydrolysis and subsequent condensation polymerization to obtain a silanol group-containing cohydrolysis-condensation polymerization product.

In the general formula (2), the unsubstituted or substituted monovalent hydrocarbon group represented by $R^3$ includes an unsubstituted or substituted monovalent hydrocarbon group having 1 to 12 carbon atoms, for example, an alkyl group such as methyl, ethyl, propyl, isopropyl, butyl, isobutyl, tert-butyl, pentyl, neopentyl, hexyl, heptyl, octyl, nonyl, decyl and dodecyl groups; a cycloalkyl group such as cyclopentyl, cyclohexyl and cycloheptyl groups; an alkenyl group such as vinyl, allyl, propenyl, isopropenyl, butenyl, isobutenyl, hexenyl and cyclohexenyl groups; an aryl group such as phenyl, tolyl, xylyl, naphthyl and biphenyl groups; an aralkyl group such as benzyl, phenylethyl, phenylpropyl and methylbenzyl groups; and a radical derived from these groups by substituting at least part of hydrogen atoms bonded to the carbon atoms of the groups with a substituent such as a halogen atom, for example, fluorine, chlorine and bromine atoms, and a cyano group, as exemplified by chloromethyl, 2-bromoethyl, 3-chloropropyl, 3,3,3-trifluoropropyl, chlorophenyl, fluorophenyl, cyanoethyl and 3,3,4,4,5,5,6,6,6-nonafluorohexyl groups.

In the general formula (2), examples of the unsubstituted or alkoxy-substituted alkyl group, generally having 1 to 12 carbon atoms, and preferably having 1 to 4 carbon atoms, represented by $R^4$ include methyl, ethyl, propyl, isopropyl, butyl, isobutyl, tert-butyl, pentyl, neopentyl, hexyl, heptyl, octyl, nonyl, decyl, dodecyl, methoxymethyl, methoxyethyl, ethoxymethyl and ethoxyethyl groups.

Specific examples of the (meth) acryloyloxypropylalkoxysilane represented by the general formula (2) include (meth) acryloyloxypropyldicarbylmonoalkoxysilanes such as acryloyloxypropyldimethylmonomethoxysilane, acryloyloxypropyldimethylmonoethoxysilane, acryloyloxypropyldiphenylmonomethoxysilane, acryloyloxypropyldiphenylmonoethoxysilane and (2-methyl) acryloyloxypropyldimethylmonoethoxysilane; (meth) acryloyloxypropylmonocarbyldialkoxysilanes such as acryloyloxypropylmonomethyldimethoxysilane, acryloyloxypropylmonomethyldiethoxysilane, acryloyloxypropylmonophenyldimethoxysilane, acryloyloxypropylmonophenyldiethoxysilane and (2-methyl) acryloyloxypropylmonomethyldiethoxysilane; and (meth) acryloyloxypropyltrialkoxysilanes such as acryloyloxypropyltrimethoxysilane, acryloyloxypropyltri (methoxyethoxy)silane, acryloyloxypropyltriethoxysilane, acryloyloxypropyltripropoxysilane, (2-methyl) acryloyloxypropyltrimethoxysilane and (2-methyl) acryloyloxypropyltriethoxysilane. They can be used singly or in a combination of two or more thereof.

In said general formula (3), examples of the unsubstituted or substituted monovalent hydrocarbon group represented by $R^5$ include the same examples as those of said $R^3$, and examples of the unsubstituted or alkoxy-substituted alkyl group represented by $R^6$ include the same examples as those of said $R^4$.

Specific examples of the alkoxysilane represented by the general formula (3) include tetramethoxysilane, tetraethoxysilane, methyltrimethoxysilane, ethyltrimethoxysilane, vinyltriethoxysilane, vinyltri(methoxyethoxy)silane, phenyltrimethoxysilane, methyltriethoxysilane, ethyltriethoxysilane, phenyltriethoxysilane, dimethyldimethoxysilane, diethyldimethoxysilane, diphenyldimethoxysilane, dimethyldiethoxysilane, diethyldiethoxysilane, diphenyldiethoxysilane, trimethylmethoxysilane, triethylmethoxysilane, triphenylmethoxysilane, trimethylethoxysilane, triethylethoxysilane and triphenylethoxysilane. Among them, particularly preferable alkoxysilanes are alkoxysilanes where in the general formula (3), n is 2 or 3.

It is preferred that the cohydrolysis of the alkoxysilane having the general formula (2) and the alkoxysilane having the general formula (3) is carried out in the presence of an acid catalyst. Usable acid catalysts include conventionally known inorganic acids and organic acids, more specifically, for example, inorganic acids such as hydrochloric acid, sulfuric acid and nitric acid, and organic acids such as acetic acid and oxalic acid. Among them, preferred is hydrochloric acid.

The amount of the acid catalyst used is generally 0.001 to 1.0 part by weight per 100 parts by weight of the total amount of the alkoxysilane having the general formula (2) and the alkoxysilane having the general formula (3).

The cohydrolysis may be carried out generally at 0° to 50° C.

Each of the reactant components in the cohydrolysis may be employed in such an amount that the amount of the alkoxysilane having the general formula (3) is preferably 0.1 to 20 moles, more preferably 0.5 to 5.0 moles, per mole of the (meth)acryloyloxypropylalkoxysilane having the general formula (2).

In case where, as the (meth)acryloyloxypropylalkoxysilane, at least two alkoxysilanes among (meth)acryloyloxypropyldicarbylmonoalkoxysilane, (meth)acryloyloxypropylmonocarbyldialkoxysilane and (meth)acryloyloxypropyltrialkoxysilane are selected and used, the amounts of these alkoxysilanes may be selected in accordance with the molecular structure of the intended high molecular weight (meth)acryloyloxyl group-containing organopolysiloxane and is not limited at all. Incidentally, since said (meth)acryloyloxypropyltrialkoxysilane is three functional, the larger the amount of the trialkoxysilane, the more the branched chains in the molecular increase.

Although the alkoxysilane of said general formula (2) and the alkoxysilane of said general formula (3) are cohydrolyzed and subsequently subjected to condensation polymerization, the cohydrolysis reaction and the condensation polymerization reaction subsequent thereto will not proceed as a clearly distinguishable different step each other. This is because part of a silanol-containing silane produced by the hydrolysis of the alkoxysilane of the general formula (2) and the alkoxysilane of the general formula (3) will condense simultaneously with the production thereof and, even the step of the condensation polymerization, the remaining alkoxyl groups will undergo additionally hydrolysis. Further, since the silanol-containing silane will condense and polymerize simultaneously with the production thereof, even when the reaction product obtained after the cohydrolysis is used intact in the subsequent silylation step, the intended organopolysiloxane having a molecular weight of 3,000 or more (in terms of polystyrene by GPC) can be sometimes obtained. However, in order to ensure the production of the organopolysiloxane, it is necessary to use the reaction product obtained after the cohydrolysis in the condensation polymerization and thereafter in the silylation step, as in the present invention.

The cohydrolysis in the present invention is carried out by reacting the above reactant components generally at 0° to 50° C. The subsequent condensation polymerization reaction is carried out by reacting the resulting cohydrolyzed product at 50° to 100° C., preferably 80° to 100° C.

As a result, in the obtained cohydrolysis-condensation polymerization product, the alkoxyl groups remain little, but part of the silanol groups remain unreacted. In the production method of the present invention, in order that the silanol groups in the intended (meth)acryloyloxyl group-containing organopolysiloxane may not remain, the cohydrolysis-condensation polymerization product is subjected to the subsequent silylation step.

(b) Silylation step of the cohydrolysis-condensation polymerization product:

In this step, said cohydrolysis-condensation polymerization product is reacted with a silylating agent to silylate the silanol groups remaining in the cohydrolysis-condensation polymerization product.

The silylating agents include, for example, a hexaorganodisilazane represented by the general formula (4):

$$R^7_3Si\text{—}NH\text{—}SiR^7_3 \qquad (4)$$

wherein $R^7$ is independently an alkyl or alkenyl group having 1 to 8 carbon atoms, such as hexaalkyldisilazane, tetraalkyldialkenyldisilazane and tetraalkenyldialkyldisilazane.

In said general formula (4), examples of the alkyl or alkenyl group having 1 to 8 carbon atoms represented by $R^7$ include the same examples as those of said $R^2$, preferably methyl and vinyl groups.

Specific examples of the hexaorganodisilazane having said general formula (4) include, for example, hexamethyldisilazane, tetramethyldibutyldisilazane, hexaethyldisilazane, tetramethyldivinyldisilazane and tetravinyldimethyldisilazane.

Examples of the silylating agent besides the hexaorganodisilazane having said general formula (4) include, for example, N-trimethylsilylacetamide, N,O-bis(trimethylsilyl)acetamide and N-trimethylsilylimidazole. Among said silylating agents, preferred is hexaalkyldisilazane, particularly hexamethyldisilazane.

The silylation reaction is generally carried in an organic solvent. The organic solvents include, for example, methyl tributyl ketone, toluene and xylene.

By the silylation, the active hydrogen atoms bonded to the silanol groups remaining in said cohydrolysis-condensation polymerization product is replaced with the inert triorganosilyl groups. Thus, in case where the silylating agent is hexamethyldisilazane, the silanol group is converted to trimethylsiloxyl group.

Although the amount of the silylating agent used is not sweepingly determined depending on the amount of the silanols remaining in the cohydorlyzed condensation polymerization product, it is generally 5% by weight or more of the cohydrolysis-condensation polymerization product. The temperature of said silylation reaction is preferably 80° C. or more, preferably 80° to 160° C., and the reaction time can be 0.5 to 3 hours.

By the silylation step, the silanol groups remaining in the cohydorlyszed condensation polymerization product is converted to substantially completely triorganosiloxy groups and becomes inactive.

The (meth)acryloloxyl group-containing organopolysiloxane obtained by subjecting said cohydrolysis-condensation polymerization product to the silylation step as mentioned above has generally an average molecular weight of 3,000 or more (in terms of polystyrene by GPC). When the organopolysiloxane is used as the base polymer of said electron beam-curable resin compositions, thermosetting resin compositions or photo-curable resin compositions, the average molecular weight thereof is preferably 3,000 to 100,000 (in terms of polystyrene by GPC), more preferably 5,000 to 50,000 (in terms of polystyrene by GPC), and according to the present invention, the organopolysiloxane having such an high molecular weight can be readily produced.

The (meth)acryloyloxyl group-containing organopolysiloxane obtained by the production method of the present invention can be easily purified by water washing and obtained in the form of a solid having a high purity. The organopolysiloxane is dissolved in an organic solvent such as toluene, xylene, methyl isobutyl ketone and acetone for use, depending on the uses thereof.

The (meth)acryloyloxyl group-containing organopolysiloxane, the component (A), having an average molecular weight, for example, a weight-average molecular weight, of 3,000 to 100,000, preferably 5,000 to 50,000, in terms of polystyrene by GPC represented by said average compositional formula (1) can be prepared by applying the general production method of the (meth)acryloyloxyl group-containing organopolysiloxane described above.

For example, the (meth)acryloyloxyl group-containing organopolysiloxane having the formula (1) can be prepared by subjecting a (meth)acryloyloxypropyltrialkoxysilane represented by the following general formula (2a):

$$CH_2=CR^1COO-C_3H_6-Si(OR^4)_3 \qquad (2a)$$

wherein $R^1$ and $R^4$ are as defined above; and a phenyltrialkoxysilane represented by the following general formula (3a):

$$PhSi(OR^6)_3 \qquad (3a)$$

wherein Ph and $R^6$ are as defined above, to cohydrolysis and subsequent condensation polymerization, and thereafter converting the silanol groups contained in the resulting cohydrolysis-condensation polymerization product to trialkylsiloxy groups. In this cohydrolysis and subsequent condensation polymerization step, for example, an organotrialkoxysilane represented by the following general formula (3b):

$$R^2Si(OR^8)_3 \qquad (3b),$$

wherein $R^2$ is as defined above, $R^8$ is an unsubstituted or alkoxy-substituted alkyl group as $R^4$ or $R^6$, such as alkyltrialkoxysilane and alkenyltrialkoxysilane, can be optionally used together with the(meth)acryloyloxypropyltrialkoxysilane having the general formula (2a) and the phenyltrialkoxysilane having the general formula (3a). The amount of the phenyltrialkoxysilane having the general formula (3a) used is generally 0.7 to 20 moles, preferably 1 to 5 moles, per mole of the (meth)acryloyloxypropyltrialkoxysilane having the general formula (2a), and the amount of the organotrialkoxysilane having the general formula (3b) used is 0 to 4 moles [preferably, the number of $R^2$ in said formula (1) is small] per mole of the (meth)acryloyloxypropyltrialkoxysilane having the general formula (2a).

Examples of each of $R^2$, $R^4$ and $R^6$ are as mentioned above, and examples of $R^8$ include the same examples as those of $R^4$ or $R^6$.

Also in this specific production method, the (meth)acryloyloxypropyltrialkoxysilane of the general formula (2a) and the phenyltrialkoxysilane of the general formula (3a) are subjected to cohydrolysis, preferably in the presence of an acid catalyst, to obtain a cohydrolysis-condensation product having silanol groups.

Specific examples of the (meth)acryloyloxypropyltrialkoxysilane represented by the general formula (2a) include acryloyloxypropyltrimethoxysilane, acryloyloxypropyltriethoxysilane, acryloyloxypropyltripropoxysilane, (2-methyl) acryloyloxypropyltrimethoxysilane and (2-methyl) acryloyloxypropyltriethoxysilane.

Specific examples of the phenyltrialkoxysilane represented by the general formula (3a) include phenyltrimethoxysilane, phenyltriethoxysilane, phenyltripropoxysilane and phenyltributoxysilane.

Specific examples of the organotrialkoxysilane represented by the general formula (3b) include methyltrimethoxysilane, methyltriethoxysilane, methyltripropoxysilane, methyltributoxysilane, ethyltrimethoxysilane, ethyltriethoxysilane, ethyltripropoxysilane, ethyltributoxysilane, propyltrimethoxysilane, propyltriethoxysilane, propyltripropoxysilane, propyltributoxysilane, vinyltriethoxysilane and vinyltri(methoxyethoxy)silane.

Examples of the acid catalyst are as mentioned above. The amount of the acid catalyst is generally 0.001 to 1.0 part by weight per 100 parts by weight of the total amount of the alkoxysilane having the general formula (2a), the alkoxysilane having the general formula (3a) and the alkoxysilane having the general formula (3b). The reaction temperature of the cohydrolysis and the reaction temperature of the condensation polymerization reaction are as mentioned above. The reaction time in the condensation polymerization reaction is preferably 30 minutes or more under the condition of the condensation polymerization reaction temperature. Particularly in order to obtain the organopolysiloxane having a molecular weight of 3,000 or more (in terms of polystyrene by GPC), it is necessary that the silanol groups produced by the above cohydrolysis and the alkoxy groups remaining even after the cohydrolysis are subjected to condensation polymerization in said reaction conditions.

In the subsequent silylation step of the cohydrolysis-condensation polymerization product, the same product is reacted with a silylating agent to silylate the remaining silanol groups, as mentioned above.

Examples of the silylating agent and examples of the organic solvent which can be used in the silylation reaction include the same examples as in said general production method. The amount of the silylating agent, and the reaction temperature and reaction time of the silylation reaction are mentioned above.

By this silylation, the silanol groups remaining in said cohydrolysis-condensation product are converted substantially completely to trialkylsiloxy groups and become inactive.

Thus, the (meth)acryloyloxyl group-containing organopolysiloxane represented by said general formula (1) is obtained. Since the obtained (meth)acryloyloxyl group-containing organopolysiloxane has little silanol groups remaining in the molecule thereof, lacks in hydrophilic nature or is high in hydrophobic nature, whereby water-soluble impurities can be readily removed by water washing said organopolysiloxane in the state of being dissolved in an organic solvent incompatible with water. Accordingly, the thus obtained (meth)acryloyloxyl group-containing organopolysiloxane can be readily and highly purified and is excellent in storage stability due to free of silanol groups. Further, the organopolysiloxane is excellent in curability and has little tackiness in uncured state after being coated.

Photosensitizer of component (B)

Examples of the photosensitizer of the component (B) used in the present invention include bisazide compounds such as 2,6-bis(p-azidobenzal)-4-tert-amylcyclohexanone, 2,6-bis(p-azidobenzal)-4-methylcyclohexanone and 4,4'-diazidobenzalacetone; coumarin dyes such as 3,3-carbonylbis(7-diethylaminocoumarin) and 6-methylcoumarin; benzophenone, and derivatives thereof such as tetra(tert-butylperoxycarbonyl)benzophenone; and benzoin, and derivatives thereof such as benzoin ethyl ether and benzoin methyl ether. Among them, preferred are 2,6-bis(p-azidebenzal)-4-tert-amylcyclohexanone, 3,3-carbonylbis(7-diethylaminocoumarin), tetra(tert-butylperoxycarbonyl)benzophenone and benzophenone.

The amount of the component (B) added is preferably 0.0001 to 20 parts by weight, more preferably 0.1 to 10 parts by weight, per 100 parts by weight of the (meth)acryloyloxyl group-containing organopolysiloxane, the component (A).

Other components

If necessary, to the photo-curable organopolysiloxane composition of the present invention in addition to said components (A) and (B), there can be added solvents, polymerization inhibitors such as hydroquinone monomethyl ether and 2,6-di(tert-butyl)-4-methylphenol, and the other additives which are generally used in photo-curable organopolysiloxane compositions.

Said solvents include, for example, toluene, xylene, methyl isobutyl ketone and 1-methoxy-2-propanol. The amount of the solvents used is preferably 40 to 80% by weight of the whole composition.

Production of photo-curable organopolysiloxane composition

The photo-curable organopolysiloxane composition of the present invention can be obtained by uniformly mixing said components (A) and (B) and, if necessary, optional components as mentioned above.

The thus obtained composition of the present invention is used, for example, in such a manner as mentioned below. The composition is coated on a predetermined substrate using a coating equipment such as spinner, a solvent contained in the composition is dried by air to form a composition film having a thickness of preferably 0.1 to 10 μm (thickness after being dried), and then, either the composition film is exposed directly to irradiation of light using a mask aligner or the like, or after the surface of the composition film was previously shielded by a photomask, the composition film is exposed to irradiation with light, to cure the exposed areas thereof. The light to be irradiated includes, for example, far ultraviolet rays (wavelength, for example: 193 nm, 253 nm); and ultraviolet rays such as i-line (wavelength: 365 nm), g-line (wavelength: 436 nm) and h-line (wavelength: 405 nm).

The uncured composition film shielded by a photomask can form a pattern corresponding to the photomask by dissolving and removing the same film using a solvent such as methyl tributyl ketone. Further, in the case of using the composition film in the passivation of semiconductors, the composition film is heated preferably at 200° to 300° C. for 1 to 4 hours to thereby completely dissipate volatile matters such as a solvent remaining in the cured composition film. Thus, a film excellent in heat resistance and adhesion can be obtained.

EXAMPLES

The present invention will be more specifically described below by refering to working examples and comparative examples. Incidentally, all average molecular weights in these examples are values in terms of polystyrene by GPC (gel permeation chromatography), and $\overline{M_w}$ herein means a weight-average molecular weight.

Example 1

Into a flask, 468 parts by weight (2 moles) of acryloyloxypropyltrimethoxysilane and 594 parts by weight (3 moles) of phenyltrimethoxysilane were charged, and thereto, a solution produced by mixing 446 parts by weight (25 moles) of water and 1.2 parts by weight of 36 wt. % hydrochloric acid as an acid catalyst was dropwise added to effect hydrolysis. Then, the resulting reaction mixture was heated to 80° C. to effect condensation polymerization while evaporating off the by-produced methanol. Thus, a reaction solution containing a cohydrolysis-condensation polymerization product having an average molecular weight ($\overline{M_w}$) of 15,000. After the cohydrolysis-condensation polymerization product was separated from the reaction solution, the product was dissolved in methyl isobutyl ketone. Thereto, 25 parts by weight of hexamethyldisilazane per 100 parts by weight of the solid matter of the cohydrolysis-condensation polymerization product was added, and the resulting admixture was heated at 100° C. for 1 hour. Thereafter, the thus obtained reaction mixture was subjected to stripping treatment under a reduced pressure of 5 mmHg at 100° C. for 1 hour to obtain a (meth)acryloyloxyl group-containing organopolysiloxane as a resinous solid.

Figure 1:
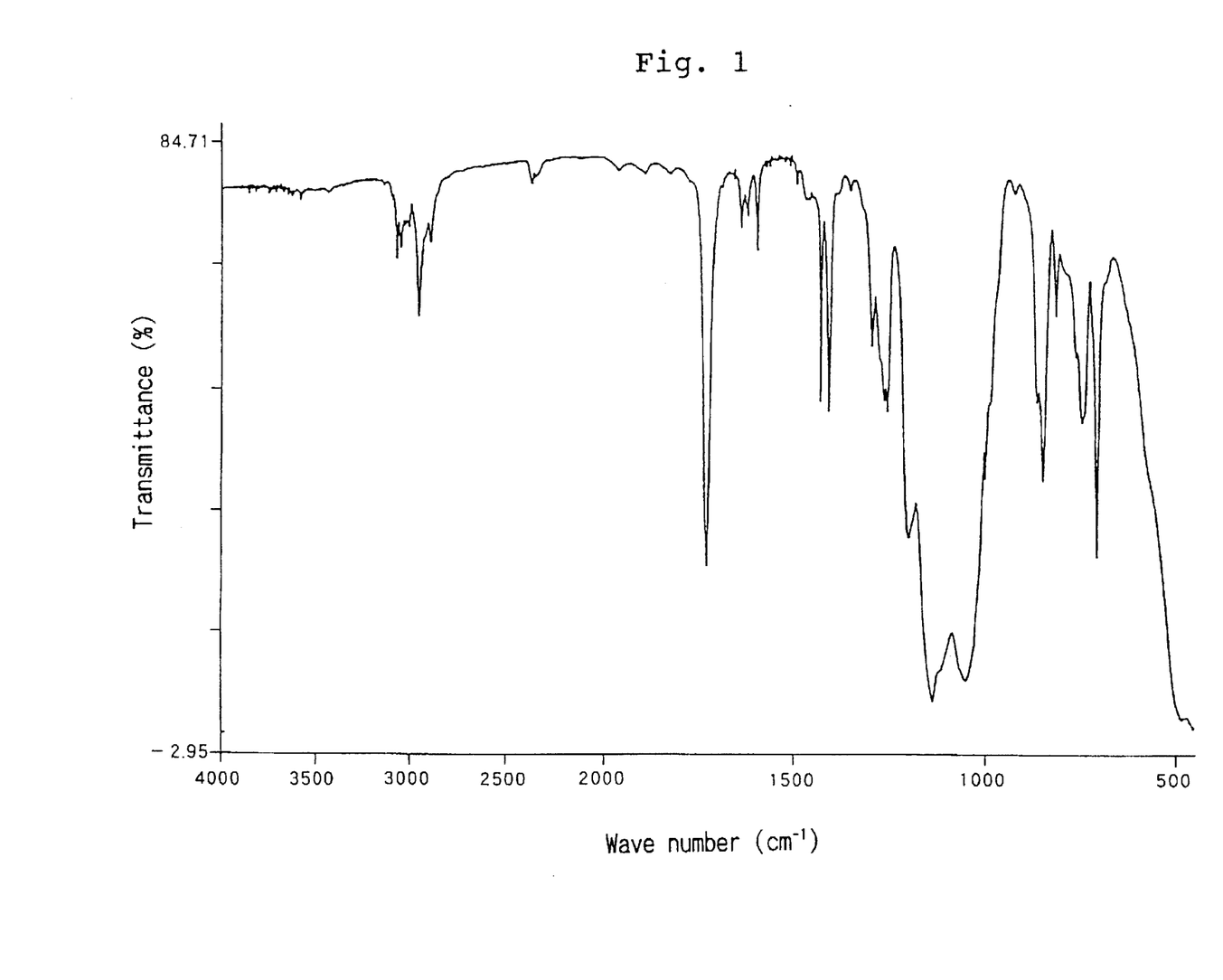
FIG. 1 is an infrared analysis chart of the (meth) acryloyloxyl group-containing organopolysiloxane of the present invention obtained in Example 1.
Figure 2:
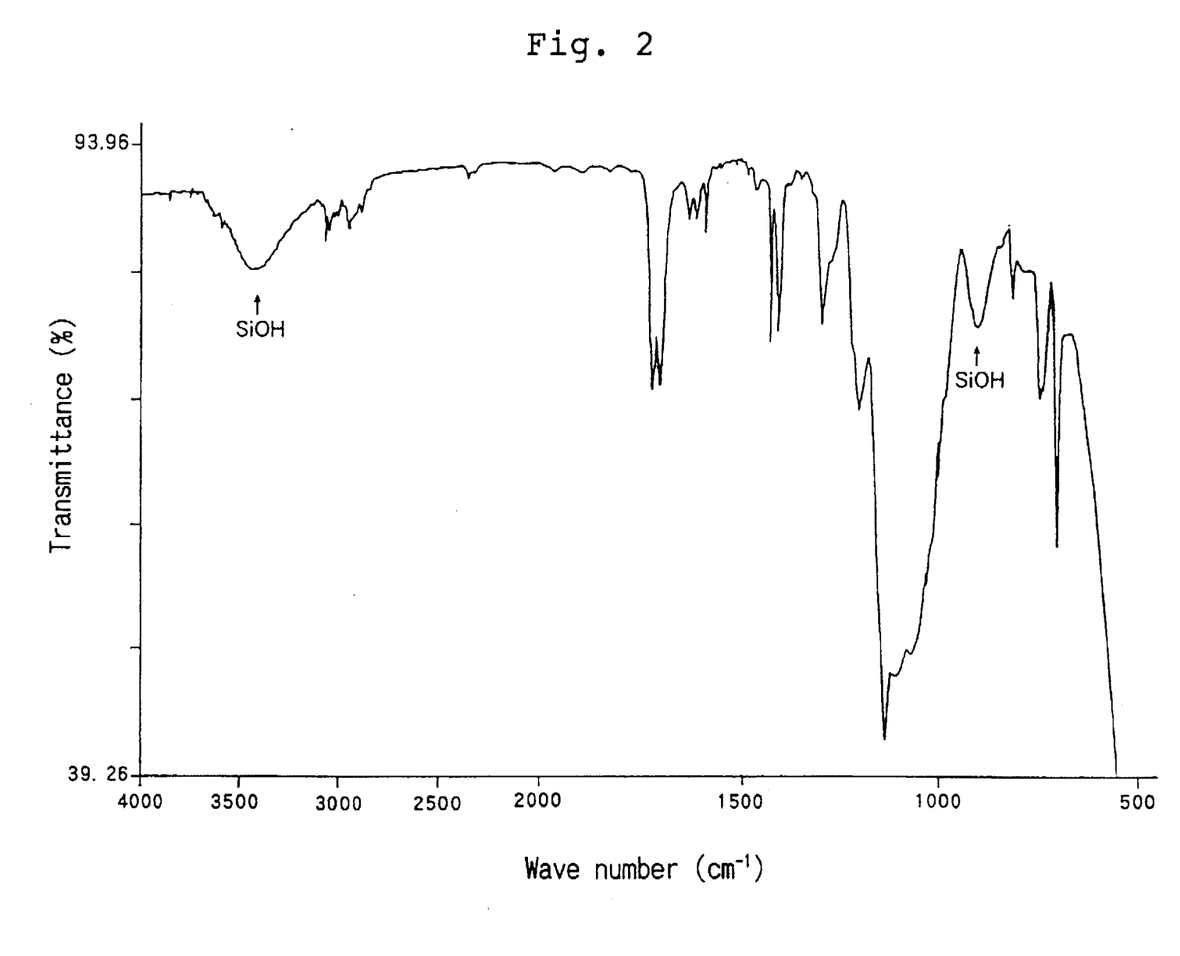
FIG. 2 is an infrared analysis chart of the cohydrolysis-condensation polymerization product prior to silylation treatment obtained in Example 1.

The obtained (meth)acryloyloxyl group-containing organopolysiloxane had an average molecular weight ($\overline{M_w}$) of 14,500 and a softening point of 55° C., with a yield being 90%. The infrared spectroscopic analysis chart of said cohydrolysis-condensation polymerization product prior to the silylation is shown in FIG. 2 and the infrared analysis chart of the (meth)acryloyloxyl group-containing organopolysiloxane of the present invention obtained by silylating the same product is shown in FIG. 1. In FIG. 2, absorption bands due to silanol groups are observed at 900 cm$^{-1}$ and about 3400 to 3500 cm$^{-1}$, while in FIG. 1, it is shown that these absorptions disappeared completely.

Example 2

A (meth)acryloyloxyl group-containing organopolysiloxane synthesized in the same manner as in Example 1 was dissolved in toluene so that the concentration of nonvolatile matters contained therein might be 35% by weight. 100 parts by weight of the thus obtained solution was washed two times with 200 parts by weight of a pure water having a conductivity of 1 μs/cm or less. As a result, the conductivity of the first waste water, which was produced from the washing water used at the first time, was 13 μs/cm, but the second waste water, which was produced from the washing water used at the second time, was lowered to 4 μs/cm.

Then, from the toluene solution of the washed (meth)acryloyloxyl group-containing organopolysiloxane, the water contained therein was removed by azeotropic distillation and subsequently the toluene was evaporated off. Thus, a (meth)acryloyloxyl group-containing organopolysiloxane having an average molecular weight ($\overline{M_w}$) of 14,000 and a softening point of 52° C. was obtained as a solid. The yield was 88%.

Comparative Example 1

Exactly the same manner as in Example 1 was repeated until the reactant components were subjected to cohydrolysis and subsequent condensation polymerization. Thus, a reaction solution containing a cohydrolysis-condensation polymerization product having an average molecular weight ($\overline{M_w}$) Of 15,000 was obtained. To 1,509.2 parts by weight of the reaction solution, 2.4 parts by weight of propylene oxide was then added and stirred in order to neutralize the acid catalyst contained therein. The resulting admixture was subjected to stripping treatment under a reduced pressure of 5 mmHg and at 100° C. to produce a cohydrolysis-condensation polymerization product as a resinous solid. The cohydrolysis condensation polymerization product had an average molecular weight ($\overline{M_w}$) of 15,500 and a softening point of 60° C., with a yield being 91%.

Comparative Example 2

A hyrolyzed condensation polymerization product, which was synthesized in the same manner as in Comparative Example 1, was dissolved in methyl isobutyl ketone so that the concentration of nonvolatile matters might be 35% by weight, and 100 parts by weight of the resulting solution was washed two times with 200 parts by weight of a pure water having a conductivity of 1 μs/cm or less. As a result, the conductivity of the first waste water, which was produced from the washing water used at the first time, was 10 μs/cm, while the second waste water, which was produced from the washing water used at the second time, was lowered to 3 μsec/cm. However, since an emulsion phase was formed in addition to an organic phase and an aqueous phase when phase separation was conducted after having been washed, the separation of the cohydrolysis-condensation polymerization product was very difficult and was accompanied by a loss of the product. Then, from the methyl isobutyl ketone solution of the washed cohydrolysis-condensation polymerization product, the water contained therein was removed by azeotropic distillation and subsequently the methyl isobutyl ketone was evaporated off. Thus, the cohydrolysis-condensation polymerization product was obtained as a solid, which had an average molecular weight ($\overline{M_w}$) of 14,500 and a softening point of 52° C. The yield was 35%.

For the (meth)acryloyloxyl group-containing organopolysiloxanes of the present invention obtained in Examples 1 and 2 and the cohydrolysis-condensation polymerization products obtained in Comparative Examples 1 and 2, a storage stability test and an evaluation of purity based on the measurement of free-chlorine content and hydrolyzable-chlorine content were conducted as described below. The results are shown in Table 1.

Storage stability test

The (meth)acryloyloxyl group-containing organopolysiloxanes obtained in Examples 1 and 2 and the cohydrolysis-condensation polymerization products obtained in Comparative Examples 1 and 2 each were dissolved in methyl isobutyl ketone so that the concentration of nonvolatile matters might be 45% by weight. The initial viscosity at 25° C. of each of the resulting solutions is shown in Table 1. Further, each solution was left to stand at 25° C. for from 1 day to 75 days at the longest to measure changes in viscosity with a lapse of time. The results are also shown in Table 1. Incidentally, "gelation" means that the solution gelled so that the measurement of viscosity was impossible.

Evaluation of purity
(Measurement of free-chlorine content)

10.0 g of a sample out of the (meth)acryloyloxyl group-containing organopolysiloxanes obtained in Examples 1 and 2 and the cohydrolysis-condensation polymerization products obtained in Comparative Examples 1 and 2 was added to 60 ml of a mixed solvent consisting of acetone and methanol (acetone:methanol=2:1). After the resulting solution was stirred by a magnetic stirrer for 30 minutes, to the solution, three droplets of a BTB solution as an indicator were added. Then, nitric acid was added thereto until the solution turned yellow, and additional three droplets of said indicator were added thereto. For this solution, potentiometric titration by a silver nitrate solution was conducted using an automatic titration equipment to measure free-chlorine content.

(Measurement of hydrolyzable-chlorine content)

The same potentiometric titration as in said measurement of free-chlorine content was conducted to measure hydrolyzable-chlorine content, except that 60 ml of the mixed solvent consisting of acetone and methanol (acetone:methanol=2:1) was replaced with 60 ml of the mixed solvent consisting of acetone and methanol (acetone:methanol=2:1) and 2 g of a 28 weight % solution of $CH_3ONa$.

TABLE 1

|  | Example 1 | Example 2 | Comp. Example 1 | Comp. Example 2 |
|---|---|---|---|---|
| Storage stability test | | | | |
| Initial | 7.7 cSt | 7.2 cSt | 8.3 cSt | 8.1 cSt |
| 25° C./1 day | 7.7 cSt | 7.2 cSt | 8.4 cSt | 9.0 cSt |
| 25° C./4 day | 7.7 cSt | 7.2 cSt | 13.7 cSt | 9.4 cSt |
| 25° C./8 day | 7.7 cSt | 7.2 cSt | 32.0 cSt | 11.3 cSt |
| 25° C./15 day | 7.7 cSt | 7.2 cSt | 44.1 cSt | 12.3 cSt |
| 25° C./30 day | 7.8 cSt | 7.3 cSt | 39.3 cSt | 25.2 cSt |
| 25° C./45 day | 7.8 cSt | 7.3 cSt | Gelation | Gelation |
| 25° C./60 day | 7.8 cSt | 7.3 cSt | | |
| 25° C./75 day | 7.8 cSt | 7.3 cSt | | |
| Evaluation of purity | | | | |
| Free chlorine content | 6 ppm | 0.5 ppm | 67 ppm | 3 ppm |
| Hydrolyzable chlorine content | 21 ppm | 19 ppm | 71 ppm | 31 ppm |

Example 3

Into a flask, 468 parts by weight of acryloyloxypropyltrimethoxysilane (①) and 792 parts by weight of phenyltrimethoxysilane (②) (molar ratio of ①:②=1:2) were charged, and thereto, a solution produced by mixing 534.2 parts by weight of water and 2 parts by weight of 36 wt. % hydrochloric acid as an acid catalyst was dropwise added over 10 minutes with stirring to effect cohydrolysis reaction. Then, the resulting reaction mixture was heated to 100° C. to effect condensation polymerization for 5 hours while evaporating off the by-produced methanol. The thus obtained cohydrolysis-condensation polymerization product was then dissolved in methyl tributyl ketone. Thereto, 25 parts by weight of hexamethyldisilazane per 100 parts by weight of the cohydrolysis-condensation polymerization product was added, and the resulting admixture was heated at 100° C. for 1 hour. Thereafter, the methyl tributyl ketone was evaporated off from the thus obtained reaction mixture under a reduced pressure of 5 mmHg at 100° C. for 1 hour to obtain (meth)acryloyloxyl group-containing organopolysiloxane of the component (A) as a resinous solid. Upon measuring the average molecular weight ($\overline{M_w}$) of the (meth)acryloyloxyl group-containing organopolysiloxane, it was found to be 7,000.

Then, a solution prepared by dissolving 100 parts by weight of the obtained (meth)acryloyloxyl group-containing organopolysiloxane and 5 parts by weight of 2,6-bis(p-azidobenzal)-4-tert-amylcyclohexanone, the component (B), in 233.4 parts by weight of methyl isobutyl ketone was filtered through a membrane filter having a pore diameter of 0.5 μm to produce the composition of the present invention.

The obtained composition was coated on a silicon wafer by spin-coating and air dried to form a composition film having a thickness of 2.5 μm. The composition film was not tacky in uncured state.

After a photomask carrying a pattern which had been previously formed corresponding to the circuit of a semiconductor was superimposed on the composition film in close contact therewith, the composition film was exposed to light (180 mJ) through the photomask using a mask aligner, followed by developing with xylene to obtain a resolution pattern of 20 μmL/S having a thickness of 1.8 μm on the silicon wafer. The resolution pattern of 20 μmL/S herein means a striped pattern in which the composition film having a width of 20 μm and a space having a width of 20 μm are alternately arranged on the silicon wafer.

Example 4

Into a flask, 468 parts by weight of acryloyloxypropyltrimethoxysilane (①) and 594 parts by weight of phenyltrimethoxysilane (②) (molar ratio of ①:②=1:5) were charged, and thereto, a solution produced by mixing 446 parts by weight of water and 1.7 parts by weight of 36 wt. % hydrochloric acid as an acid catalyst was dropwise added to effect hydrolysis reaction. Then, the resulting reaction mixture was heated to 80° C. to effect condensation polymerization while evaporating off the by-produced methanol. The thus obtained cohydrolysis-condensation polymerization product was then dissolved in methyl tributyl ketone. Thereto, 25 parts by weight of hexamethyldisilazane per 100 parts by weight of the cohydrolysis-condensation polymerization product was added, and the resulting admixture was heated at 100° C. for 1 hour. Thereafter, the methyl tributyl ketone was evaporated off from the thus obtained reaction mixture under a reduced pressure of 5 mmHg at 100° C. for 1 hour to obtain a (meth)acryloyloxyl group-containing organopolysiloxane of the component (A) as a resinous solid. Upon measuring the average molecular weight ($\overline{M_w}$) of the (meth)acryloyloxyl group-containing organopolysiloxane, it was found to be 12,000.

Then, a solution prepared by dissolving 100 parts by weight of the obtained (meth)acryloyloxyl group-containing organopolysiloxane and, as the component (B), 4 parts by weight of tetra(tert-butylperoxycarbonyl)benzophenone and 0.005 part by weight of 3,3-carbonylbis(7-diethylaminocoumarin) in 233.4 parts by weight of methyl isobutyl ketone was filtered through a membrane filter having a pore diameter of 0.5 μm to produce a composition of the present invention.

The obtained composition was coated on a silicon wafer by spin-coating and air dried to form a composition film having a thickness of 2.5 μm. The composition film was not tacky in uncured state.

After a photomask carrying a pattern which had been previously formed corresponding to the circuit of a semiconductor was superimposed on the composition film in close contact therewith, the composition film was exposed to light (708 mJ) through the photomask using a mask aligner, followed by developing with methyl isobutyl ketone to obtain a resolution pattern of 20 μmL/S having a thickness of 1.7 μm on the silicon wafer.

Example 5

A cohydrolysis-condensation polymerization product was prepared by carrying out the same cohydrolysis and subsequent condensation polymerization as in Example 4.

The obtained cohydrolysis-condensation polymerization product was treated with hexamethyldisilazane in the same manner as conducted in Example 1 to produce a (meth)acryloyloxyl group-containing organopolysiloxane of the component (A). Upon measuring the average molecular weight ($\overline{M_w}$) of the (meth)acryloyloxyl group-containing organopolysiloxane, it was found to be 12,000.

100 parts by weight of the (meth)acryloyloxyl group-containing organopolysiloxane was dissolved in 200 parts by weight of toluene. The thus obtained solution was washed two times with 600 parts by weight of a pure water every time. Upon measuring the conductivity of the resulting waste water separated therefrom at this time, it was found to be 3 μs/cm.

Then, from the toluene solution of the washed (meth)acryloyloxyl group-containing organopolysiloxane, the water contained therein was removed by azeotropic distillation and subsequently the toluene was evaporated off to purify the organopolysiloxane.

Thereafter, a solution prepared by dissolving 100 parts by weight of the thus purified (meth)acryloyloxyl group-containing organopolysiloxane and, as a component (B), 4 parts by weight of tetra(tert-butylperoxycarbonyl)benzophenone and 0.005 part by weight of 3,3-carbonylbis(7-diethylaminocoumarin) in 233.4 parts by weight of methyl isobutyl ketone was filtered through a membrane filter having a pore diameter of 0.5 μm to produce a composition of the present invention.

Upon measuring the concentration of impurities contained in the composition, it was found that $Na^+$ was 1 ppm or less, $K^+$ 1 ppm or less, and $Cl^-$ 1 ppm or less.

The obtained composition was coated on a silicon wafer by spin-coating and air dried to form a composition film having a thickness of 2.5 μm. The composition film was not tacky in uncured state.

After a photomask carrying a pattern which had been previously formed corresponding to the circuit of a semiconductor was superimposed on the composition film in close contact therewith, the composition film was exposed to light (708 mJ) through the photomask using a mask aligner, followed by dissolving and removing uncured areas of the composition film in methyl isobutyl ketone to obtain a resolution pattern of 20 μmL/S having a thickness of 1.7 μm on the silicon wafer.

Comparative Example 3

Into a flask, 468 parts by weight of acryloyloxypropyltrimethoxysilane (①) and 198 parts by weight of phenyltrimethoxysilane (②) (molar ratio of ①:②=1:0.5) were charged, and thereto, a solution produced by mixing 334 parts by weight of water and 1.3 part by weight of 36 wt. % hydrochloric acid as an acid catalyst was dropwise added to effect cohydrolysis reaction. Then, the resulting reaction mixture was heated to 80° C. to effect condensation polymerization while evaporating off the by-produced methanol. The thus obtained cohydrolysis-condensation polymerization product was then dissolved in methyl isobutyl ketone. Thereto, 25 parts by weight of hexamethyldisilazane per 100 parts by weight of the cohydrolysis-condensation polymerization product was added, and the resulting admixture was heated at 100° C. for 1 hour. Thereafter, the methyl isobutyl ketone was evaporated off from the thus obtained reaction mixture under a reduced pressure of 5 mmHg at 100° C. to obtain a highly tacky resin. The resin was tacky and unsuitable as a photo-curable organopolysiloxane composition for which a photomask was used. Upon measuring the average molecular weight ($\overline{M_w}$) of the resin, it was found to be 9,000.

Comparative Example 4

The same formulation as in Example 3 was employed. That is, 468 parts by weight of acryloyloxypropyltrimethoxysilane (①) and 792 parts by weight of phenyltrimethoxysilane (②) (molar ratio of ①:②=1:2) were charged into a flask, and thereto, a solution produced by mixing 534.2 parts by weight of water and 2 parts by weight of 36 wt. % hydrochloric acid as an acid catalyst was dropwise added over 10 minutes with stirring to effect cohydrolysis reaction. Then, the resulting reaction mixture was heated to 100° C. to effect condensation polymerization for one hour while evaporating off the by-produced methanol. The thus obtained cohydrolysis-condensation polymerization product was then dissolved in methyl tributyl ketone. Thereto, 25 parts by weight of hexamethyldisilazane per 100 parts by weight of the cohydrolysis-condensation polymerization product was added, and the resulting admixture was heated at 100° C. for 1 hour. Thereafter, the methyl tributyl ketone was evaporated off from the thus obtained reaction mixture under a reduced pressure of 5 mmHg at 100° C. to obtain a high viscous resin in the form of glutinous starch syrup. The resin was tacky and unsuitable as a photo-curable organopolysiloxane composition for which a photomask was used. Upon measuring the average molecular weight ($\overline{M_w}$) of the resin, it was found to be 2,000.

Comparative Example 5

The same formulation as in Example 3 was employed. That is, 468 parts by weight of acryloyloxypropyltrimethoxysilane (①) and 792 parts by weight of phenyltrimethoxysilane (②) (molar ratio of ①:②=1:2) were charged into a flask, and thereto, a solution produced by mixing 534.2 parts by weight of water and 2 parts by weight of 36 wt. % hydrochloric acid as an acid catalyst was dropwise added over 10 minutes with stirring to effect cohydrolysis reaction. Then, the resulting reaction mixture was heated to 100° C. and heating was continued while evaporating off the by-produced methanol to effect condensation polymerizationat at 150° C. for 10 hours. Although the thus obtained cohydrolysis-condensation polymerization product was then tried to be dissolved in methyl tributyl ketone, it was difficult to uniformly dissolve the condensation polymerization product. Upon measuring the average molecular weight ($\overline{M_w}$) of the condensation polymerization product, it was found to be 110,000.

Comparative Example 6

Into a flask, 468 parts by weight of acryloyloxypropyltrimethoxysilane (①) and 9,900 parts by weight of phenyltrimethoxysilane (②) (molar ratio of ①:②=1:25) were charged, and thereto, a solution produced by mixing 4,450 parts by weight of water and 16.6 parts by weight of 36 wt. % hydrochloric acid as an acid catalyst was dropwise added over 10 minutes with stirring to effect cohydrolysis reaction. Then, the resulting reaction mixture was heated to 100° C. to effect condensation polymerization for 5 hours while evaporating off the by-produced methanol. The thus obtained cohydrolysis-condensation polymerization product was then dissolved in methyl tributyl ketone. Thereto, 25 parts by weight of hexamethyldisilazane per 100 parts by weight of the cohydrolysis-condensation polymerization product was added, and the resulting admixture was heated at 100° C. for 1 hour. Thereafter, the methyl tributyl ketone was evaporated off from the thus obtained reaction mixture under a reduced pressure of 5 mmHg at 100° C. for 1 hour to obtain a resinous solid. Upon measuring the average molecular weight ($\overline{M_w}$) of the resinous solid, it was found to be 6,000.

Then, a solution prepared by dissolving 100 parts by weight of the obtained resinous solid and 5 parts by weight of 2,6-bis(p-azidobenzal)-4-tert-amylcyclohexanone in 233.4 parts by weight of methyl isobutyl ketone was filtered through a membrane filter having a pore diameter of 0.5 μm to produce a photo-curable composition.

The obtained composition was coated on a silicon wafer by spin-coating and air dried to form a composition film having a thickness of 2.5 μm. The composition film was not tacky in uncured state.

After a photomask carrying a pattern which had been previously formed corresponding to the circuit of a semiconductor was superimposed on the composition film in close contact therewith, the composition film was exposed to light (708 mJ) through the photomask using a mask aligner, followed by developing with xylene. However, since the composition film had a low photosensitivity and was not cured sufficiently, the composition was dissolved in the xylene and, as a result, a pattern corresponding to the photomask could not be formed on the silicon wafer.

Storage stability test for the composition of the invention

Figure 3:
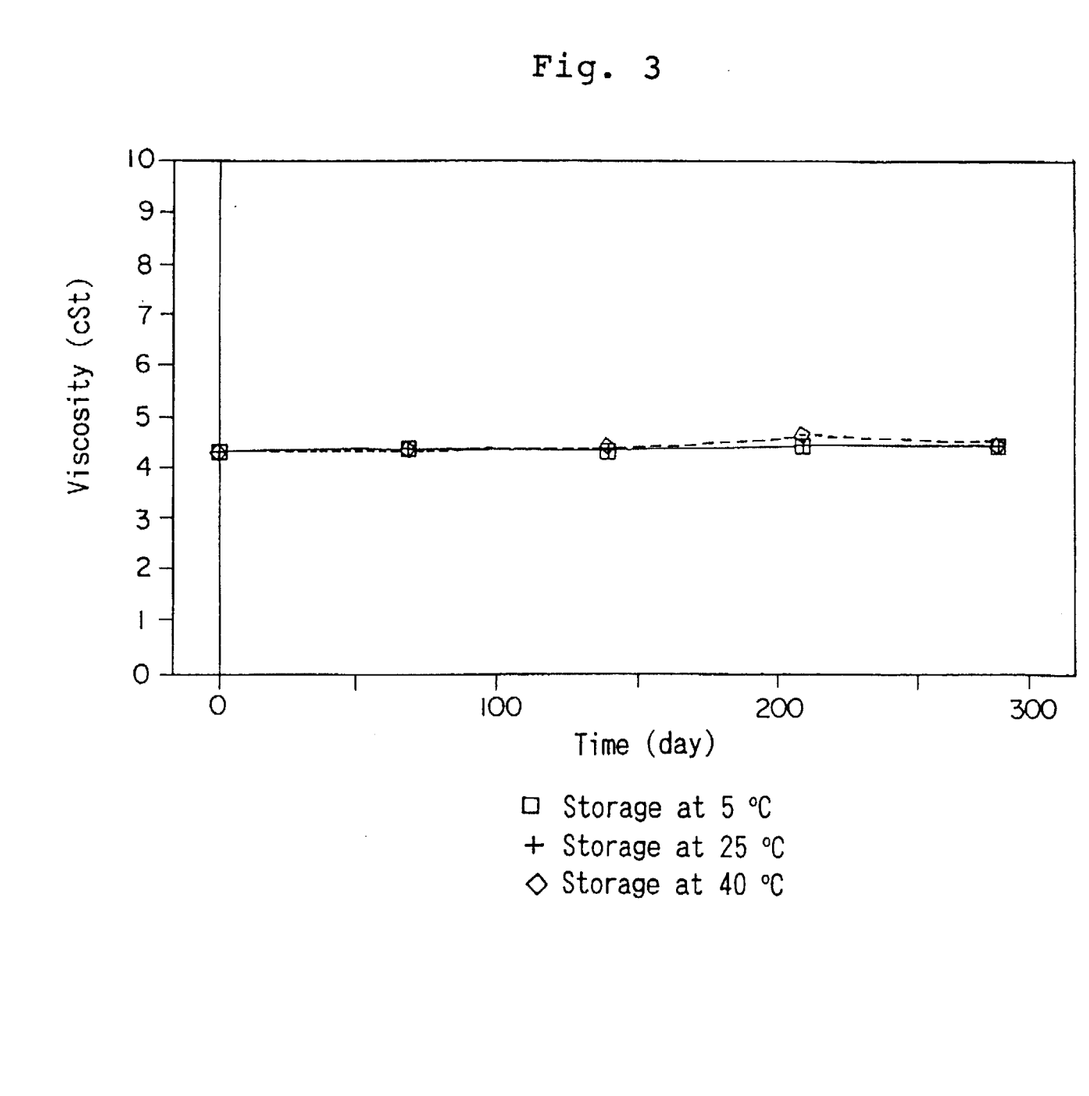
FIG. 3 is a graph showing the result of storage stability test as to the composition of the present invention.
Figure 4:
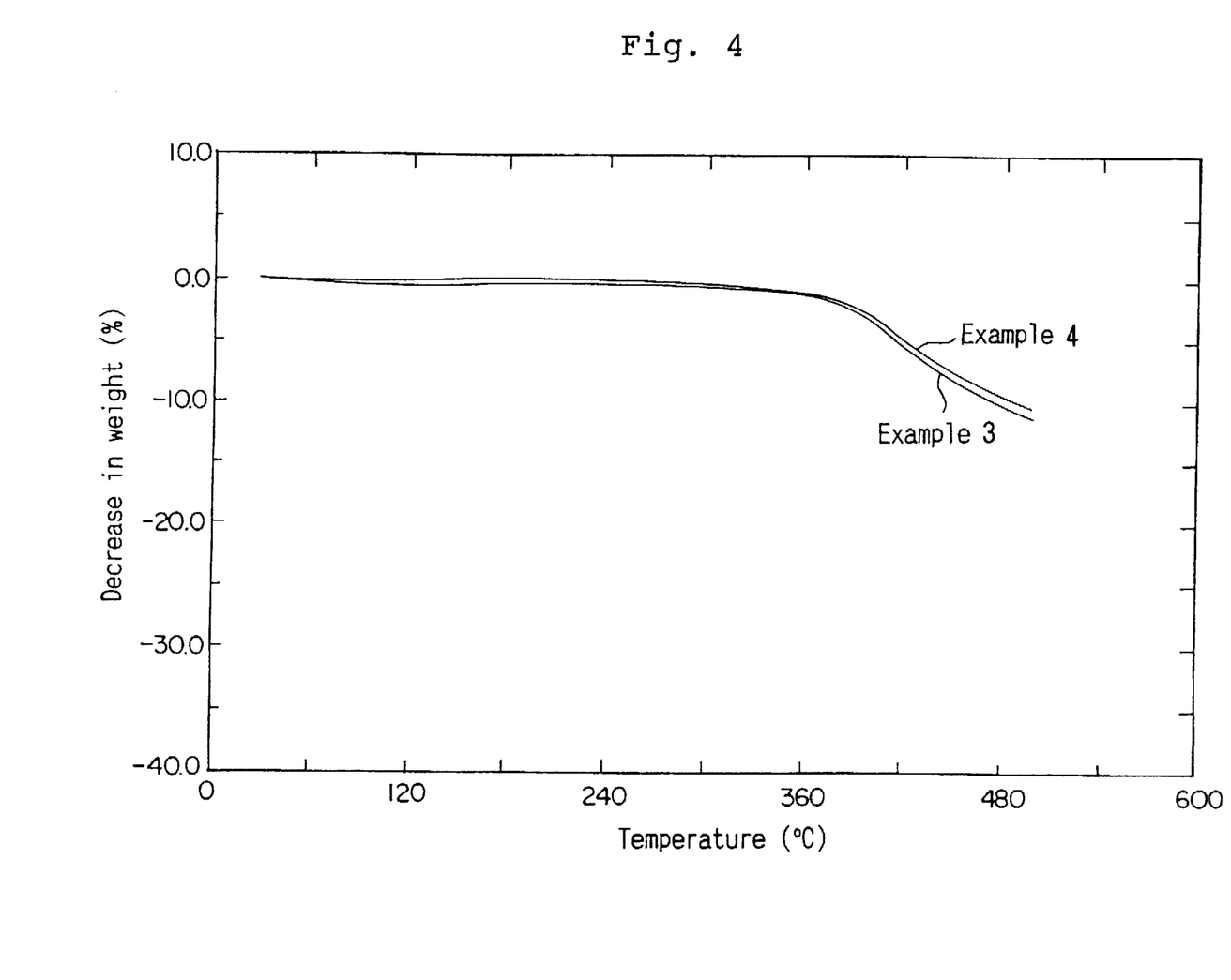
FIG. 4 is a graph showing the result of heat resistance test as to the composition of the present invention.

The composition obtained in Example 4 was sealed in a container and stored at each of the temperatures of 5° C., 25° C. and 40° C. to measure changes in viscosity with a lapse of time. The results are shown in FIG. 3 in which the axis of ordinate represents viscosities (cSt) at 25° C. of the composition and the axis of abscissa represents storage time (days).

Heat resistance test for the composition of the invention

Each of the cured products of the compositions obtained in Examples 3 and 4 was treated at 300° C. for 4 hours using a thermo-balance, and a decrease of weight during the 4-hours was measured with a lapse of time.

What is claimed is:

1. A photo-curable organopolysiloxane composition comprising:

(A) an acryloyloxyl or methacryloyloxyl group-containing organopolysiloxane having an average molecular weight of 3,000 to 100,000 in terms of polystyrene by GPC represented by the following average compositional formula (1):

$(CH_2=CH^1COOC_3H_6-)_a(Ph)_bR^2_c(R^7_3SiO)_dSiO_{(4-a-b-c-d)/2}$ (1)

wherein $R^1$ represents a hydrogen atom or a methyl group, $R^2$ represents an alkyl or alkenyl group having 1 to 8 carbon atoms, Ph stands for a phenyl group, $R^7$ represents an alkyl or alkenyl group having 1 to 8 carbon atoms, a is a number satisfying $0.05<a<0.9$, b is a number satisfying $0.1<b<0.9$, c is a number satisfying $0 \leq c<0.2$, and d is a number satisfying $0<d \leq 0.5$, provided that a+b+c+d should satisfy $0.8 \leq a+b+c+d \leq 1.5$; and (B) a photosensitizer, said acryloyloxy or methacryloyloxy group-containing organopolysiloxane (A) being produced by subjecting an (meth)acryloyloxypropyltrialkoxysilane of the formula (2a):

$CH_2=CR^1COO-C_3H_6-Si(OR^4)_3$ (2a)

wherein $R^1$ is as defined above, and $R^4$ represents an unsubstituted or alkoxy-substituted alkyl group; and a phenyltrialkoxysilane of the formula (3a):

$PhSi(OR^6)_3$ (3a)

wherein Ph is as defined above, and $R^6$ is an unsubstituted or alkoxy-substituted alkyl group, to cohydrolysis and subsequent condensation polymerization, and thereafter converting the silanol groups contained in the resulting cohydrolysis-condensation polymerization product to trialkylsiloxy groups, the molar ratio of phenyltrialkoxysilane of the formula (3a) to (meth)acryloyloxypropyltrialkoxysilane of the formula (2a) being 1–5:1.

2. The composition of claim 1, wherein in the cohydrolysis and subsequent condensation polymerization step of the production of acryloyloxyl or methacryloyloxyl group-containing organopolysiloxane having the average compositional formula (1), an alkyltrialkoxysilane represented by the following general formula (3b):

$$R^2Si(OR^8)_3 \tag{3b}$$

wherein $R^2$ is as defined in claim 1, and $R^8$ is an unsubstituted or alkoxy-substituted alkyl group, is further present.

3. The composition of claim 1, wherein the alkyl or alkenyl group having 1 to 8 carbon atoms represented by $R^2$ and $R^7$ in the average compositional formula (1) is selected from methyl, ethyl, propyl, isopropyl, butyl, isobutyl, tertbutyl, pentyl, neopentyl, hexyl, heptyl, cyclohexyl, cycloheptyl, octyl, 2-ethylhexyl, vinyl, allyl, propenyl, isopropenyl and butenyl groups.

4. The composition of claim 1, wherein the photosensitizer of the component (B) is contained in an amount of 0.0001 to 20 parts by weight per 100 parts by weight of the component (A).

5. The composition of claim 1, the acryloyloxyl or methacryloyloxyl group-containing organopolysiloxane of the component (A) having the average compositional formula (1) has an average molecular weight of 5,000 to 50,000 in terms of polystyrene by GPC.

* * * * *